United States Patent
Kim et al.

(10) Patent No.: US 12,336,345 B2
(45) Date of Patent: Jun. 17, 2025

(54) MICRO-LENS ARRAY HAVING COLOR-CONVERSION FUNCTION, MICRO-LED DISPLAY MODULE INCLUDING MICRO-LENS ARRAY, AND METHOD FOR MANUFACTURING MICRO-LENS ARRAY

(71) Applicant: ANYCASTING CO., LTD., Seoul (KR)

(72) Inventors: Sungbin Kim, Seoul (KR); Chankyu Park, Gimpo-si (KR); Kunwoong Ko, Seoul (KR)

(73) Assignee: ANYCASTING CO., LTD., Seoul (KR)

(*) Notice: Subject to any disclaimer, the term of this patent is extended or adjusted under 35 U.S.C. 154(b) by 641 days.

(21) Appl. No.: 17/780,520

(22) PCT Filed: Nov. 27, 2020

(86) PCT No.: PCT/KR2020/017126
§ 371 (c)(1),
(2) Date: May 27, 2022

(87) PCT Pub. No.: WO2021/107698
PCT Pub. Date: Jun. 3, 2021

(65) Prior Publication Data
US 2022/0416135 A1    Dec. 29, 2022

(30) Foreign Application Priority Data
Nov. 29, 2019 (KR) .................. 10-2019-0156226

(51) Int. Cl.
*H10H 20/851*    (2025.01)
*G02B 3/00*    (2006.01)
(Continued)

(52) U.S. Cl.
CPC ....... *H10H 20/8516* (2025.01); *G02B 3/0037* (2013.01); *H10H 20/01* (2025.01);
(Continued)

(58) Field of Classification Search
CPC .......... H10H 20/8514; H10H 20/8516; H10H 20/855–856; G02B 3/0037–0068
See application file for complete search history.

(56) References Cited

U.S. PATENT DOCUMENTS

2018/0284534 A1    10/2018 Song et al.

FOREIGN PATENT DOCUMENTS

| KR | 10-1630632 B1 | 6/2016 |
| KR | 10-1657954 B1 | 9/2016 |

(Continued)

OTHER PUBLICATIONS

International Search Report in International Application No. PCT/KR2020/017126, dated Mar. 12, 2021, 2pages.

*Primary Examiner* — Amar Movva
(74) *Attorney, Agent, or Firm* — Park, Kim & Suh, LLC (57) ABSTRACT

The present invention relates to a micro-lens array having a color-conversion function and provided in a micro-LED display module, a micro-LED display module including the micro-lens array, and a method for manufacturing the micro-lens array. An micro-lens array according to an embodiment of the present invention is provided in a micro-LED display module in which micro-LEDs themselves are used as light-emitting materials. The micro-lens array may comprise: a body; bank parts formed to be recessed inward from one surface of the body so as to be in one-to-one correspondence with the micro-LEDs, respectively; lens parts formed to protrude from the opposite surface of the body so as to be in one-to-one correspondence with the bank parts, respectively; a partition wall part formed between the bank parts;

(Continued)

and a color-conversion part provided in each of the bank parts so as to convert the color of light emitted from each of the micro-LEDs.

20 Claims, 7 Drawing Sheets

(51) Int. Cl.
  *H10H 20/01* (2025.01)
  *H10H 20/856* (2025.01)
(52) U.S. Cl.
  CPC .... *H10H 20/8512* (2025.01); *H10H 20/8514* (2025.01); *H10H 20/856* (2025.01); *H10H 20/0361* (2025.01); *H10H 20/0363* (2025.01)

(56) References Cited

FOREIGN PATENT DOCUMENTS

| | | |
|---|---|---|
| KR | 10-2018-0118488 A | 10/2018 |
| KR | 10-2019-0065570 A | 6/2019 |

MICRO-LENS ARRAY HAVING COLOR-CONVERSION FUNCTION, MICRO-LED DISPLAY MODULE INCLUDING MICRO-LENS ARRAY, AND METHOD FOR MANUFACTURING MICRO-LENS ARRAY

CROSS-REFERENCE TO RELATED APPLICATIONS

This application is the National Stage filing under 35 U.S.C. 371 of International Application No. PCT/KR2020/017126, filed on Nov. 27, 2020, which claims the benefit of Korean Patent Application No. 10-2019-0156226, filed on Nov. 29, 2019, the contents of which are all hereby incorporated by reference herein in their entirety.

FIELD OF INVENTION

The present disclosure relates to a micro-lens array provided in a micro-LED display module and having a color-conversion function, a micro-LED display module including the micro-lens array, and a method of manufacturing the micro-lens array.

BACKGROUND OF INVENTION

A micro LED is an ultra-small LED with a size of 100 μm or less (a chip size is about 5 to 100 μm), is suitable for realizing a flexible screen because there is no problem of breaking when bent due to a small size thereof, is far superior to a conventional display in terms of color reproducibility, power consumption and response speed, and also has an advantage in that a display is enlarged and transparent.

Accordingly, recently, a micro LED display using the micro LED has attracted attention as a next-generation display.

While core materials of an LCD and an OLED are liquid crystal and organic materials, respectively, the micro LED display refers to a display that uses a micro LED chip with a size of about 5 to 100 μm as a light emitting material.

The micro LED display has an advantage in brightness, a contrast ratio, energy efficiency, and response time compared to an existing display. In particular, the micro LED display may make VR/AR devices light and clear, and may also be enlarged, and there are various potential applications, such as attracting attention in TV and signage lighting markets.

In such a micro LED display, one pixel needs to include three red, green, and blue LED chips, and accordingly, each of the red, green, and blue LED chips needs to be sequentially transferred to a predetermined position on a substrate and to be assembled. However, in order to realize a high-resolution micro LED display, a large number, e.g., about 6.22 million (based on R, G, B chips), of micro LEDs to realize FHD level (1,920×1,080) resolution are necessary, it is very difficult to transfer the micro LEDs to predetermined positions and to assemble the micro LEDs using the current technology, and even if it is possible, there is a problem that a considerable process time is inevitably required for this.

SUMMARY OF INVENTION

Technical Problem to be Solved

To overcome the above problems, the present disclosure may provide a micro-lens array having a color-conversion function, a micro-LED display module including the micro-lens array, and a method of manufacturing the micro-lens array.

Technical Solution

According to an embodiment of the present disclosure, a micro-lens array included in a micro-LED display module using a micro LED as a light emitting material includes a body, a bank portion recessed inward from one surface of the body in one-to-one correspondence to each of micro-LEDs, a lens part protruding on an opposite surface of the body in one-to-one correspondence to each of the micro-LEDs, a barrier rib formed between the bank portions, and a color converter included in the bank portion and configured to convert color of light emitted from each of the micro-LEDs.

According to an embodiment of the present disclosure, the color converter may be integrally formed with the body by injecting quantum dot (QD) ink into the bank portion and curing the QD ink.

According to an embodiment of the present disclosure, the micro-LED may be a blue LED for emitting blue light, and the color converter may include a green converter formed by injecting quantum dot (QD) ink for converting light emitted from the blue LED to green light and curing the QD ink, a red converter formed by injecting quantum dot (QD) ink for converting blue light emitted from the blue LED to red light and curing the QD ink, and a space portion for emitting the blue light emitted from the blue LED without changes.

According to an embodiment of the present disclosure, the micro-lens array may further include a first light absorption layer formed on a bottom surface of the barrier rib to absorb light incident on the bottom surface of the barrier rib.

According to an embodiment of the present disclosure, the micro-lens array may further include a light reflection layer formed on a side surface of the bank portion to reflect light emitted to the side surface of the bank portion.

An embodiment of the present disclosure may provide a micro-LED display module using a micro LED as a light emitting material and including a substrate with the micro LED, and a micro-lens array provided above the substrate, the micro-lens array including a body, a bank portion recessed inward from one surface of the body in one-to-one correspondence to each of the micro-LEDs, a lens part protruding on an opposite surface of the body in one-to-one correspondence to each of the micro-LEDs, a barrier rib formed between the bank portions, and a color converter included in the bank portion and configured to convert color of light emitted from each of the micro-LEDs.

According to an embodiment of the present disclosure, the micro-LED display module may be attached and coupled to an upper part of the substrate by an optical clear adhesive (OCA).

According to an embodiment of the present disclosure, a method of manufacturing a micro-lens array includes a mold preparation operation of preparing a first mold having one surface, on which an engraved shape of the lens part is formed, and a second mold having one surface, on which an embossed shape of the bank portion is formed, a mold alignment operation of aligning the first mold and the second mold with each other on a base mold in a state of being spaced apart at a predetermined interval to allow the engraved shape of the lens part and the embossed shape of the bank portion to be arranged in one-to-one correspondence to each other, a polymer injection and curing operation of forming the body including the lens part and the bank portion by injecting transparent polymer into a space between the first mold and the second mold and curing the transparent polymer, and a color converter forming operation of forming the color converter in the bank portion.

Effect of Invention

When the micro-LED display module according to an embodiment of the present disclosure as configured above is used, even if a single color white or blue micro LED is used for the micro LEDs, RGB may be implemented to display a color image, and thus it may be possible to manufacture a micro-LED display module, and furthermore, it may be possible to shorten an assembly process time of the module.

When the micro-lens array and the micro-LED display module according to an embodiment of the present disclosure are used, the MLA may have a color-conversion function itself, and thus even if a single blue color micro LED is used to shorten an assembly process time of the micro-LED display module, a color image may be displayed by implementing RGB without a need to separately manufacture the color-conversion film and to attach and couple the same.

When the micro-lens array and the micro-LED display module according to an embodiment of the present disclosure are used, a color mage may be displayed by implementing RGB without a need to separately manufacture the color-conversion film and to attach and couple the same, and thus, differently from the case in which the color-conversion film is separately manufactured, attached, and coupled, the module may be manufactured with only one high-precision bonding, the possibility of peeling due to thermal deformation when the display is driven may be remarkably reduced, there is no need to separately manufacture the color-conversion film, thereby reducing manufacturing costs, and it may be possible to eliminate light loss that occurs as light emitted from the micro-LEDs passes through the color-conversion film, thereby increasing optical efficiency.

Effects according to the present disclosure are not limited to the effects mentioned above, and other effects not mentioned understood clearly to those of ordinary skill in the art to which the present disclosure belongs from the description of the claims and detailed description.

BEST MODE

The present disclosure will now be described more fully with reference to the accompanying drawings, in which exemplary embodiments of the present disclosure are shown. In the drawings, the same elements are denoted by the same reference numerals, and a repeated explanation thereof will not be given.

The terms such as "first" and "second" are used herein merely to describe a variety of constituent elements, but the constituent elements are not limited by the terms. The terms are used only for the purpose of distinguishing one constituent element from another constituent element.

When a certain part "includes" a certain component, this indicates that the part may further include another component instead of excluding another component unless there is no different disclosure.

In the drawings, the thickness or size of each layer (film), region, pattern, or structure may be changed for clarity and convenience of description, and thus does not fully reflect the actual size. In the description of the embodiments, it will be understood that, each layer (film), region, pattern, or structure is referred to as being "over", "on", or "under" a substrate, each layer (film), a pad, or patterns, each layer (film), region, pattern, or structure may be directly or indirectly formed.

In addition, the term "on" means to be positioned above or below a target member, and may not necessarily mean to be positioned above the target member in a direction of gravity.

In this specification, relative terms such as 'upper', 'lower', 'top', 'bottom', 'up', 'down', etc. are used to describe a relationship between components based on a direction shown in the drawings, and the present disclosure is not limited by such terms.

Each embodiment may be implemented independently or together, and some components may be excluded in accordance with the purpose of the present disclosure.

Figure 1:
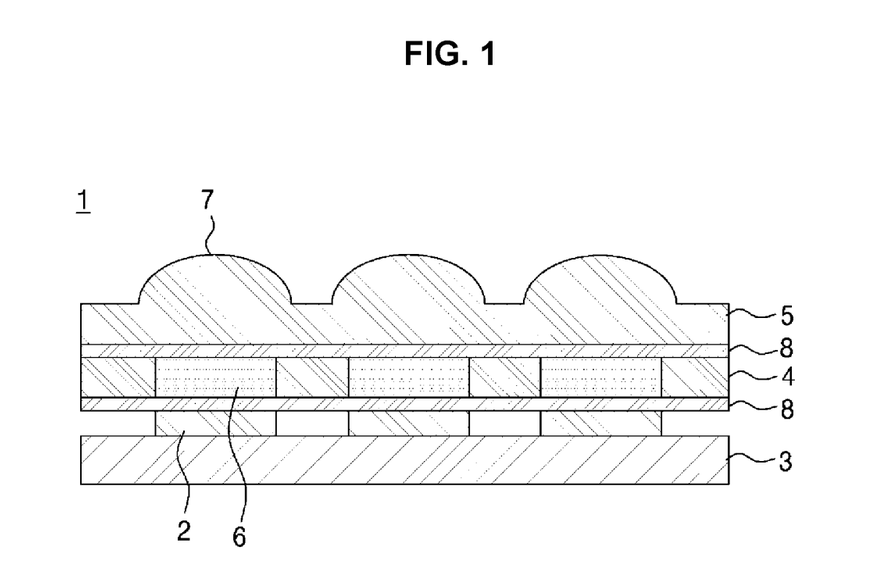
FIG. 1 is a schematic diagram showing a micro-LED display module according to an embodiment of the present disclosure.

FIG. 1 is a schematic diagram showing a micro-LED display module according to an embodiment of the present disclosure.

Referring to FIG. 1, a micro-LED display module 1 according to an embodiment of the present disclosure may include a substrate 3 including a plurality of micro LEDs 2, a color-conversion film 4 disposed above the substrate 3, and a micro-lens array 5 disposed above the color-conversion film 4.

A micro LED display refers to a display that uses a micro LED chip itself as a light emitting material.

The micro LEDs 2 may be ultra-small LEDs having a size of approximately 5 to 100 μm, and the plurality of micro LEDs 2 may be provided on the substrate 3 and may be controlled to display various pieces of image information.

The micro LEDs 2 may be white or blue monochromatic micro LEDs, and the color-conversion film 4 may include a color converter 6 for converting color of light emitted from the micro LEDs 2 in one-to-one correspondence to each of the micro-lens array 5, and the micro-lens array 5 may include a lens part 7 for increasing light efficiency by adjusting a divergence angle of the light emitted from the micro LEDs 2 in one-to-one correspondence to each of the micro LEDs 2.

The color-conversion film 4 may be attached and coupled to an upper part of the substrate 3 by an optically transparent adhesive film (OCA) 8, and the micro-lens array 5 may be attached to an upper part of the substrate 3 by the optically transparent adhesive film (OCA) 8.

When the micro-LED display module 1 according to an embodiment of the present disclosure as configured above is used, even if a single color white or blue micro LED is used for the micro LEDs 2, RGB may be implemented to display a color image, and thus it may be possible to manufacture a micro-LED display module, and furthermore, it may be possible to shorten an assembly process time of the module.

However, in manufacturing the micro-LED display module 1, there may be a difficulty in that the color-conversion film 4 and the micro-lens array 5 are separately manufactured and then are attached to each other using the optically transparent adhesive film (OCA) 8.

That is, in order to manufacture the micro-LED display module 1, first, the color-conversion film 4 may be attached to the upper part of the substrate 3 using the OCA 8, and then the micro-lens array 5 may be attached to the upper part of the color-conversion film 4 using the OCA 8 again, and in this case, although the micro LEDs 2, the color converter 6, and the lens part 7 need to be adhered to each other with high precision in the state in which the color converter 6, and the lens part 7 are aligned exactly in one-to-one correspondence, since the micro LEDs 2 have a size of at least several tens of micrometers, it may be technically very difficult to perform high-precision bonding twice, and peeling may occur due to thermal deformation when the display is driven.

Figure 2:
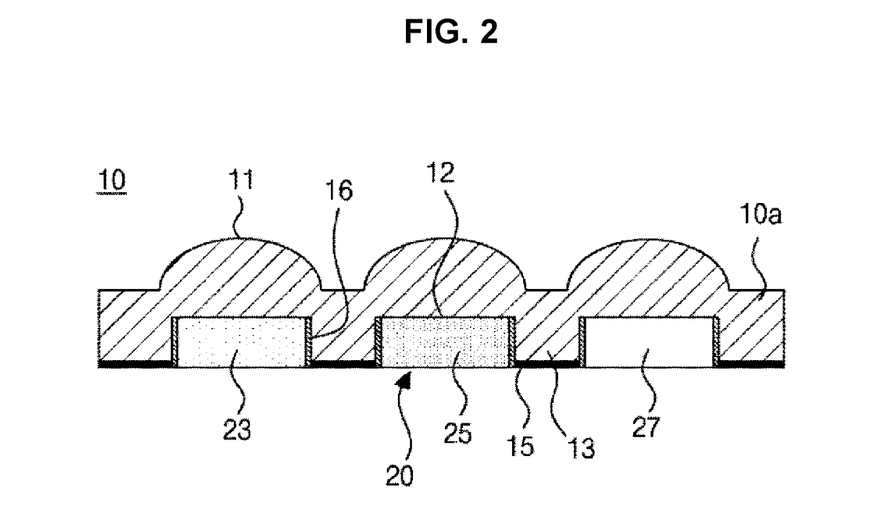
FIG. 2 is a schematic diagram showing a micro-lens array according to an embodiment of the present disclosure.
Figure 3:
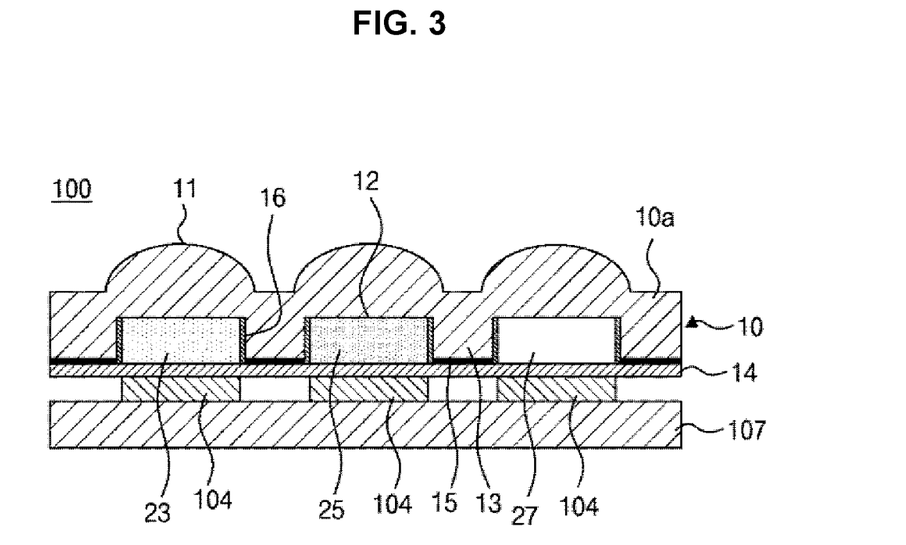
FIG. 3 is a schematic diagram showing a micro-LED display module to which the micro-lens array of FIG. 2 is coupled.

FIG. 2 is a schematic diagram showing a micro-lens array according to an embodiment of the present disclosure. FIG. 3 is a schematic diagram showing a micro-LED display module to which the micro-lens array of FIG. 2 is coupled.

Referring to FIGS. 2 and 3, a micro-LED display module 100 according to an embodiment of the present disclosure may include a plurality of micro-LEDs 104, and a micro-lens array (MLA) 10 having a color-conversion function.

The micro LED 104 may be an ultra-small LED with a size of about 5 to 100 μm, and the plurality of micro-LEDs 104 may be provided on a circuit board 107 and may be controlled to display various pieces of image information.

The MLA 10 may include a body 10a, a plurality of bank portions 12 recessed inward from one surface (a bottom surface in the drawing) of the body 10a in one-to-one correspondence to each of the plurality of micro-LEDs 104, a lens part 11 protruding on an opposite surface (a top surface in the drawing) of the body 10a in one-to-one correspondence to each of the plurality of bank portions 12, a barrier rib 13 formed between the plurality of bank portions 12, and a color converter 20 provided in a bank portion 12 and configured to convert color of light emitted from each of the plurality of micro-LEDs 104.

The lens part 11 may increase optical efficiency by adjusting a divergence angle of the light emitted from each of the plurality of micro-LEDs 104 and extracting total internally reflected light to an upper surface and may be shaped like a convex lens protruding on one surface of the MLA 10.

The color converter 20 may implement RGB by changing a wavelength of light emitted from each of the micro-LEDs 104, and may be integrally formed with the body 10a by injecting quantum dot (QD) ink into the bank portion 12 and curing the QD ink.

The quantum dot (OD) (quantum dot) is a semiconductor material having a crystal structure of several nanometers, and refers to an aggregate of specific molecules that convert energy of a light wavelength into energy of a specific other wavelength of light. In general, the quantum dot (QD) has a characteristic whereby light of a shorter wavelength is emitted as the size thereof is smaller, and light of a longer wavelength is emitted as the size thereof is larger.

Thus, when the characteristics of the quantum dot (QD) is used, even if a single color white or blue micro LED is used for the plurality of micro-LEDs 104 in order to shorten an assembly process time of the micro-LED display module 100, a color image may be displayed by implementing RGB without a need to separately manufacture the color-conversion film 4 and to attach and couple the same like the micro-LED display module 1.

For example, the plurality of micro-LEDs 104 may be blue LEDs for emitting blue light, and the color converter 20 may include a green converter 23 formed by injecting quantum dot (QD) ink for converting blue light emitted from the blue LED to green light and curing the QD ink, a red converter 25 formed by injecting quantum dot (QD) ink for converting blue light emitted from the blue LED to red light and curing the QD ink, and a space portion 27 that emits blue light from the blue LED without changes (that is, the space portion 27 is the bank portion 12 in which the quantum dot (QD) ink is not injected).

That is, the MLA 10 may have a color-conversion function itself by integrally forming the lens part 11 and the color converter 20 with the body 10a, and thus even if a single color micro LED is used for the plurality of micro-LEDs 104 in order to shorten an assembly process time of the micro-LED display module 100, a color image may be displayed by implementing RGB without a need to separately manufacture the color-conversion film 4 and to attach and couple the same like in the micro-LED display module 1.

As shown in FIG. 3, the MLA 10 may be attached and coupled to an upper part of the plurality of micro-LEDs 104 using an optical clear adhesive (OCA) 14.

Thus, when the MLA 10 and the micro-LED display module 100 according to an embodiment of the present disclosure are used, a color image may be displayed by implementing RGB without a need to separately manufacture the color-conversion film 4 and to attach and couple the same, and thus, unlike the micro-LED display module 1 in which the color-conversion film 4 is separately manufactured, attached, and coupled, the micro-LED display module 100 may be manufactured with only one high-precision bonding using the optical clear adhesive (OCA) 14, and thus the possibility of peeling due to thermal deformation when the display is driven may be remarkably reduced compared with the micro-LED display module 1, and there is no need to separately manufacture the color-conversion film 4, thereby reducing manufacturing costs, and it may be possible to eliminate light loss that occurs as light emitted from the micro-LEDs 104 passes through the color-conversion film 4, thereby increasing optical efficiency.

The MLA 10 may further include a first light absorption layer 15 formed on a bottom surface of the barrier rib 13 to absorb light incident on the bottom surface of the barrier rib 13.

The first light absorption layer 15 may realize a high level of color reproduction range by absorbing light incident on the barrier rib 13 from the plurality of micro-LEDs 104 and preventing color mixing due to the light incident on the barrier rib 13 and may be formed using a method such as blackening treatment.

The MLA 10 may further include a light reflection layer 16 formed on a side surface of the bank portion 12 to reflect light emitted to the side surface of the bank portion 12.

The light reflection layer 16 may prevent light emitted from the plurality of micro-LEDs 104 from being emitted to the side surface of the bank portion 12 when passing through the color converter 20, thereby preventing color mixing and simultaneously improving overall light efficiently, and may be formed using a method such as mirror coating, silver (Ag), or evaporation.

Figure 4:
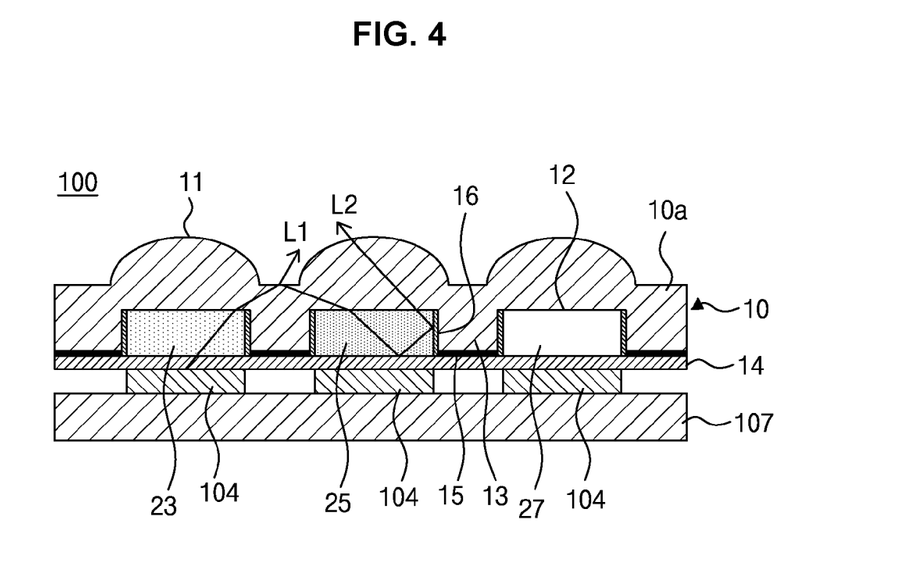
FIG. 4 is a schematic diagram showing the state in which color mixing occurs in a micro-LED display module according to an embodiment of the present disclosure.

FIG. 4 is a schematic diagram showing the state in which color mixing occurs in a micro-LED display module according to an embodiment of the present disclosure.

As shown in FIG. 4, in the micro-LED display module 100 according to an embodiment of the present disclosure, light passing through the color converter 20 from the plurality of micro-LEDs 104 may include a light beam L1 emitted to a region between the lens parts 11 and a light beam L2 emitted to another adjacent lens part 11 after total reflection or Fresnel reflection in the region between the lens parts 11, and the light beams L1 and L2 may cause color mixing.

Thus, the micro-LED display module 100 according to an embodiment of the present disclosure need to prevent color mixing due to the light beams L1 and L2 for a high color reproduction range.

Hereinafter, various embodiments of the MLA 10 for preventing color mixing due to the light beams L1 and L2 will be described with reference to the drawings.

Figure 5:
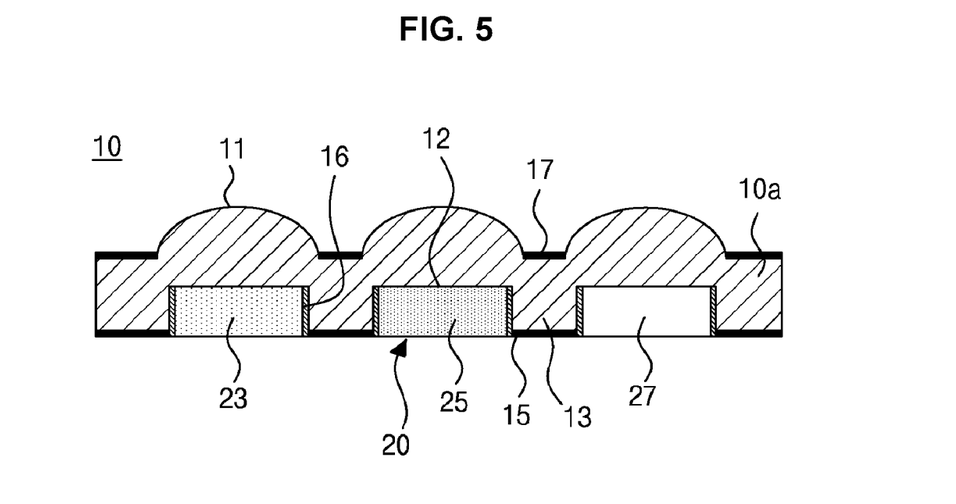
FIG. 5 is a schematic diagram showing a micro-lens array according to another embodiment of the present disclosure.

FIG. 5 is a schematic diagram showing a micro-lens array according to another embodiment of the present disclosure.

Referring to FIG. 5, the MLA 10 according to the present embodiment may further include a second light absorption layer 17 formed in a region between the lens parts 11 on an opposite surface (a bottom surface in the drawing) of the body 10a to absorb the light emitted to the region between the lens parts 11.

Then, the second light absorption layer 17 may absorb light emitted from the plurality of micro-LEDs 104 to the region between the lens parts 11 through the color converter 20, thereby preventing color mixing due to the light beams L1 and L2.

The second light absorption layer 17 may be formed using a method such as blackening treatment.

Figure 6:
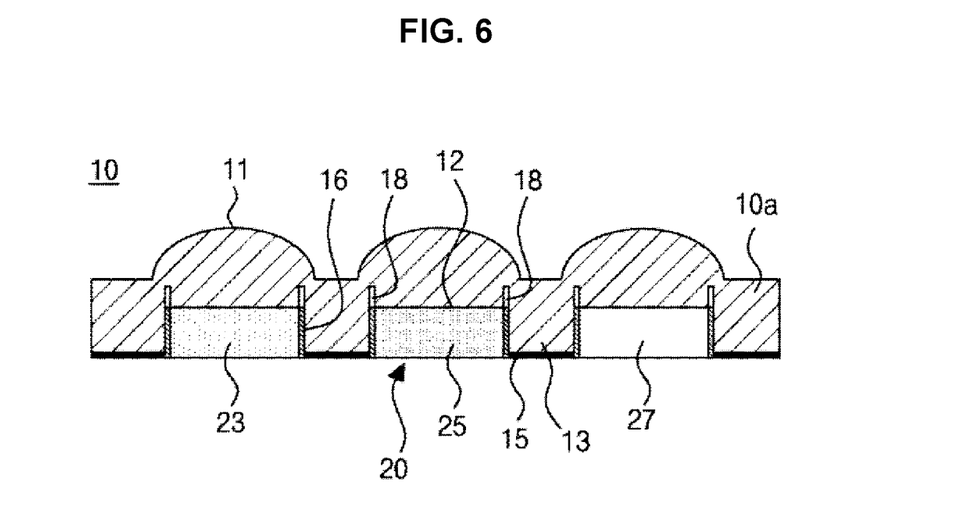
FIG. 6 is a schematic diagram showing a micro-lens array according to another embodiment of the present disclosure.

FIG. 6 is a schematic diagram showing a micro-lens array according to another embodiment of the present disclosure.

Referring to FIG. 6, the MLA 10 according to the present embodiment may further include an air layer 18 that is recessed in a direction toward the lens part 11 at an edge of a bottom surface of the bank portion 12 and totally reflects light emitted to the region between the lens parts 11.

Then, light emitted from the plurality of micro-LEDs 104 to the region between the lens parts 11 through the color converter 20 may be totally reflected by the air layer 18 to be incident on and emitted to the lens part 11 formed in one-to-one correspondence to the color converter 20, thereby preventing color mixing due to the light beams L1 and L2.

Figure 7:
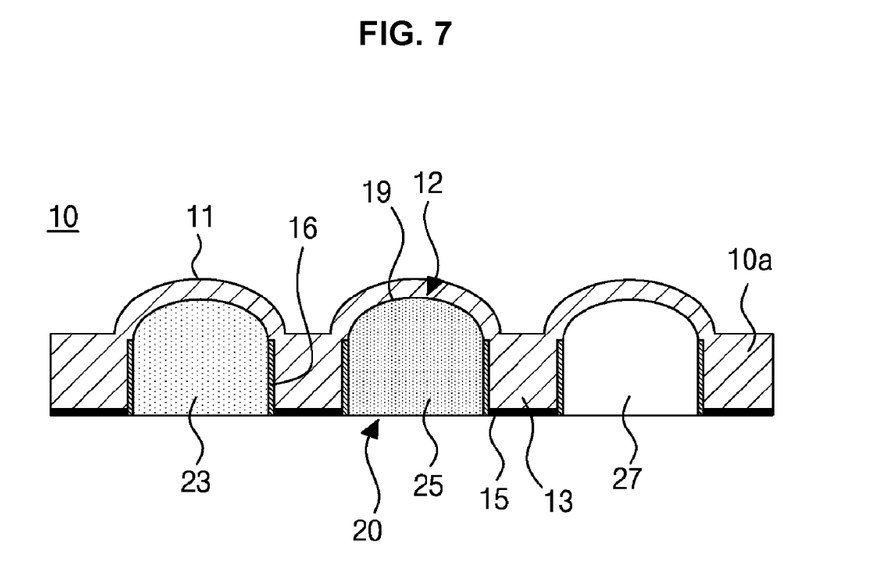
FIG. 7 is a schematic diagram showing a micro-lens array according to another embodiment of the present disclosure.

FIG. 7 is a schematic diagram showing a micro-lens array according to another embodiment of the present disclosure.

Referring to FIG. 7, a bottom surface 19 of the bank portion 12 of the MLA 10 according to the present embodiment may be convex in a direction toward the lens part 11 to allow light passing through the color converter 20 to be condensed to the lens part 11.

Then, light emitted from the plurality of micro-LEDs 104 through the color converter 20 may be incident on and emitted to the lens part 11 formed in one-to-one correspondence to the color converter 20, thereby preventing color mixing due to the light beams L1 and L2.

Hereinafter, a method of manufacturing the MLA 10 having the aforementioned configuration will be described in detail.

Figure 8:
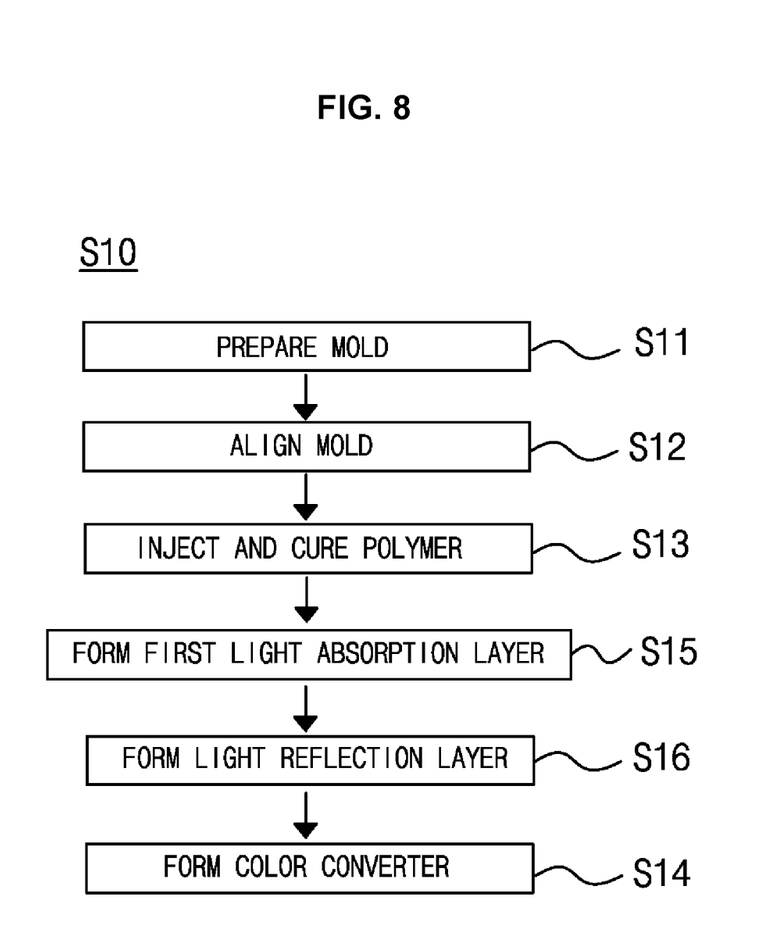
FIG. 8 is a schematic flowchart of a method of manufacturing a micro-lens array according to an embodiment of the present disclosure.
Figure 9:
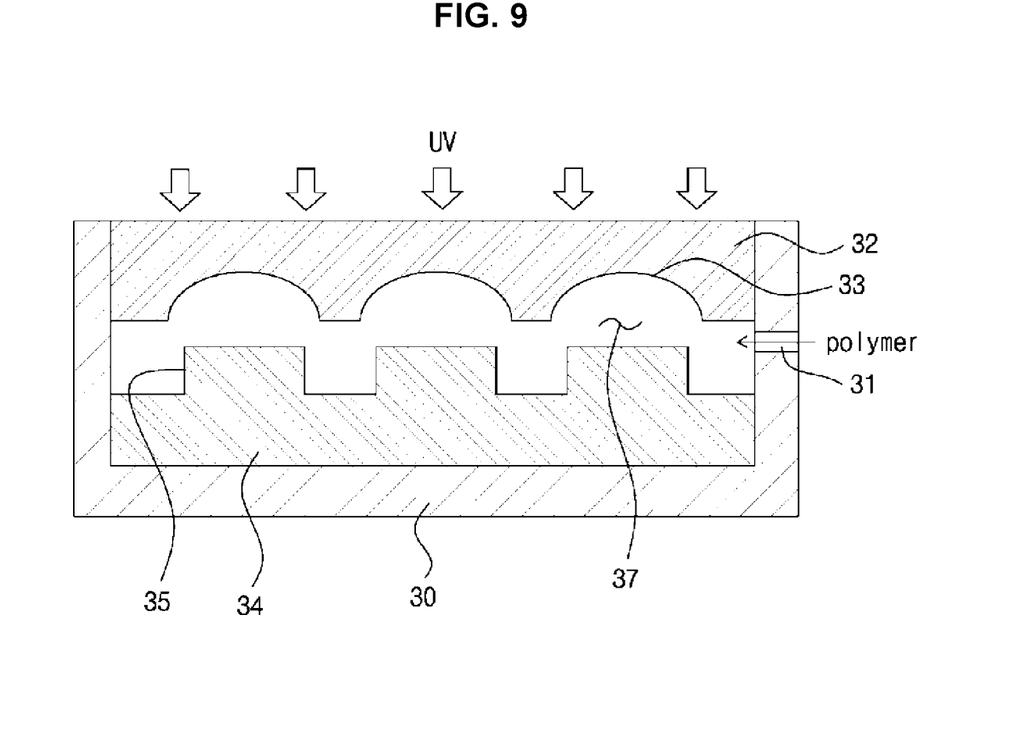
FIG. 9 is a schematic diagram showing a polymer injection and curing phase state according to an embodiment of the present disclosure.

FIG. 8 is a schematic flowchart of a method of manufacturing a micro-lens array according to an embodiment of the present disclosure. FIG. 9 is a schematic diagram showing a polymer injection and curing phase state according to an embodiment of the present disclosure.

Referring to FIGS. 8 and 9, a micro-lens array manufacturing method S10 according to an embodiment of the present disclosure may include a mold preparation operation S11, a mold alignment operation S12, a polymer injection and curing operation S13, and a color converter forming operation S14.

In the mold preparation operation S11, a first mold 32 having one surface, on which an engraved shape 33 of the lens part 11 is formed, and a second mold 34 having one surface, on which an embossed shape 35 of the bank portion 12 is formed, may be prepared.

In the mold alignment operation S12, the first mold 32 and the second mold 34 may be aligned with each other on a base mold 30 in the state of being spaced apart at a predetermined interval to allow the engraved shape 33 of the lens part 11 and the embossed shape 35 of the bank portion 12 to be arranged in one-to-one correspondence to each other.

In the polymer injection and curing operation S13, the body 10a including the lens part 11 and the bank portion 12 may be formed by injecting transparent polymer (e.g., silicon) into a space 37 between the first mold 32 and the second mold 34 and curing the transparent polymer.

To this end, an inlet 31 for injecting transparent polymer may be formed in the base mold 30.

The polymer injection and curing operation S13 may be performed using UV curing or thermal curing, but the present disclosure is not limited thereto.

However, in the polymer injection and curing operation S13, when UV curing is performed, at least one of the first mold 32 or the second mold 34 may be formed of transparent glass, and UV may be emitted to a mold formed of the transparent glass.

For example, as shown in FIG. 9, the first mold 32 may be formed of transparent glass, and in this case, UV may be emitted to the first mold 32.

The color converter forming operation S14 may be an operation in which the color converter 20 is formed in the bank portion 12 and may be performed by injecting quantum dot (QD) ink into the bank portion 12 and curing the QD ink.

In this case, when the plurality of micro-LEDs 104 uses a blue LED emitting blue light, the color converter forming operation S14 may include forming the green converter 23 by injecting quantum dot (QD) ink for converting light emitted from the blue LED to green light into a part of the bank portion 12 and curing the QD ink, and forming the red converter 25 by injecting quantum dot (QD) ink for converting blue light emitted from the blue LED to red light into a part of the bank portion 12 and curing the QD ink.

To this end, the color converter forming operation S14 may include a green converter forming operation of injecting quantum dot (QD) ink for converting light emitted from the blue LED to green light and curing the QD ink, and a red converter forming operation of injecting quantum dot (QD) ink for converting blue light emitted from the blue LED to red light and curing the QD ink.

The micro-lens array manufacturing method S10 according to an embodiment of the present disclosure may further include a first light absorption layer forming operation S15 of forming the first light absorption layer 15 on the bottom surface of the barrier rib 13.

The first light absorption layer forming operation S15 may be an operation of forming the first light absorption layer 15 by performing blackening treatment on the bottom surface of the barrier rib 13 and may be performed in the state in which the bank portion 12 is hidden using a predetermined mask.

Although FIG. 8 illustrates the case in which the first light absorption layer forming operation S15 is performed prior to the color converter forming operation S14, the first light absorption layer forming operation S15 may be performed after the color converter forming operation S14, and the present disclosure is not limited thereto.

The micro-lens array manufacturing method S10 according to an embodiment of the present disclosure may further include a light reflection layer forming operation S16 of forming the light reflection layer 16 on the side surface of the bank portion 12 prior to the color converter forming operation S14.

The light reflection layer forming operation S16 may be performed using a method such as mirror coating, silver (Ag), or evaporation and may be performed in the state in which the bottom surface of the bank portion 12 is hidden using a predetermined mask.

Although FIG. 8 illustrates that the light reflection layer forming operation S16 is performed after the first light absorption layer forming operation S15, the light reflection layer forming operation S16 may be performed prior to the first light absorption layer forming operation S15, and the present disclosure is not limited thereto.

The first light absorption layer forming operation S15 according to an embodiment of the present disclosure may further include a second light absorption layer forming operation of forming the second light absorption layer 17 between the lens parts.

The second light absorption layer forming operation may be performed in the state in which the lens part 11 is hidden using a predetermined mask, may be performed prior to, after, or simultaneously with the first light absorption layer forming operation S15, may be performed prior to or after the light reflection layer forming operation S16, or may be performed prior to or after the color converter forming operation S14, and the present disclosure is not limited thereto.

Figure 10:
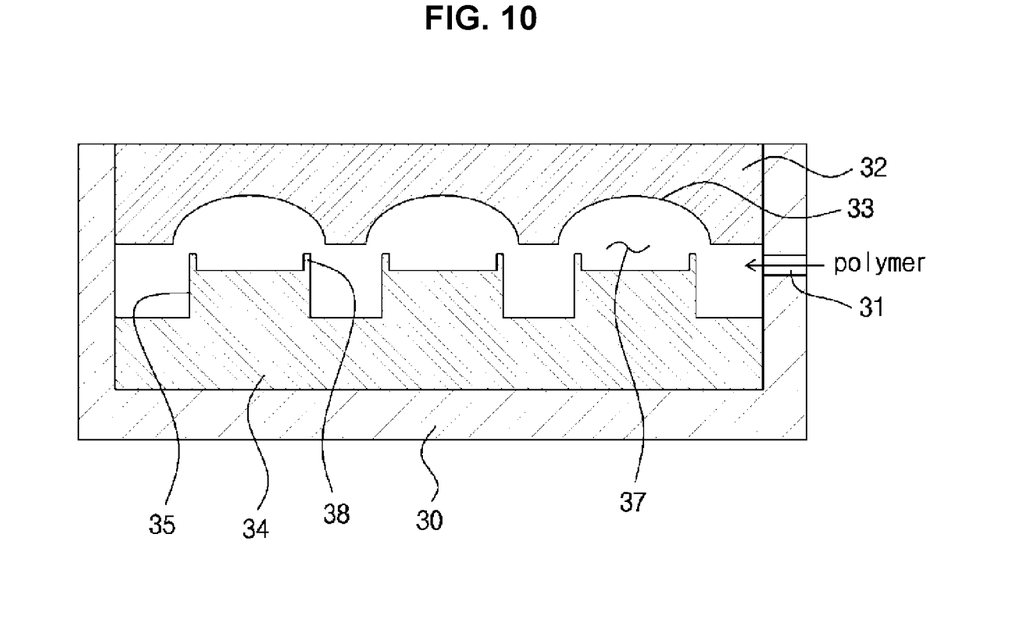
FIG. 10 is a schematic diagram showing the state of a polymer injection and curing operation according to another embodiment of the present disclosure.

FIG. 10 is a schematic diagram showing the state of a polymer injection and curing operation according to another embodiment of the present disclosure.

Referring to FIG. 10, the MLA 10 may include the air layer 18 that is recessed in a direction toward the lens part 11 at an edge of a bottom surface of the bank portion 12, and to this end, a protrusion 38 for forming the air layer 18 on an edge of the embossed shape 35 of the bank portion 12 may be formed on the second mold 34.

Figure 11:
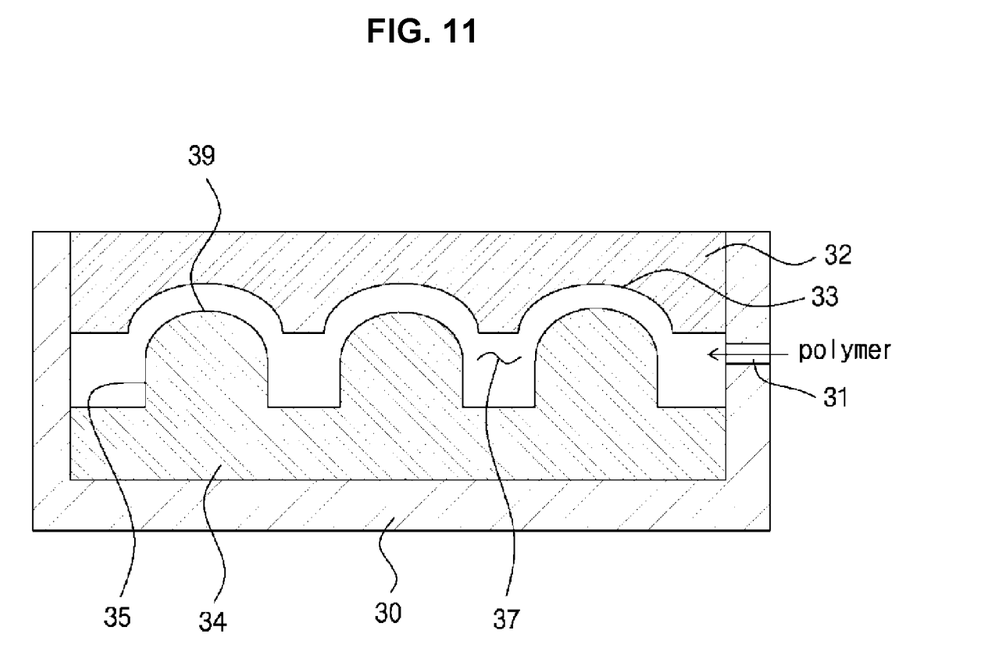
FIG. 11 is a schematic diagram showing the state of a polymer injection and curing operation according to another embodiment of the present disclosure.

FIG. 11 is a schematic diagram showing the state of a polymer injection and curing operation according to another embodiment of the present disclosure.

Referring to FIG. 11, a bottom surface of the bank portion 12 may be convex in a direction toward the lens part 11, and to this end, a top surface 39 of the embossed shape 35 of the bank portion 12 of the second mold 34 may be convex in a direction toward the engraved shape 33 of the lens part 11 of the first mold 32.

As described above, the present disclosure relates to a micro-lens array provided in a micro-LED display module and having a color-conversion function, a micro-LED display module including the micro-lens array, and a method of manufacturing the micro-lens array, and embodiments of the present disclosure may be changed in various forms. Accordingly, the present disclosure is not limited by the embodiments disclosed herein, and all forms that may be changed by one of ordinary skill in the art to which the present disclosure pertains will fall within the scope of the present disclosure.

The invention claimed is:

1. A micro-lens array included in a micro-LED display module using a micro LED as a light emitting material, comprising:
    a body;
    a bank portion recessed inward from one surface of the body in one-to-one correspondence to each of micro-LEDs;
    a lens part protruding on an opposite surface of the body in one-to-one correspondence to each of the micro-LEDs;
    a barrier rib formed between the bank portions; and
    a color converter included in the bank portion and configured to convert color of light emitted from each of the micro-LEDs.

2. The micro-lens array of claim 1, wherein the color converter is integrally formed with the body by injecting quantum dot (QD) ink into the bank portion and curing the QD ink.

3. The micro-lens array of claim 2, wherein the micro-LED is a blue LED for emitting blue light, and
    wherein the color converter includes:
    a green converter formed by injecting quantum dot (QD) ink for converting light emitted from the blue LED to green light and curing the QD ink;
    a red converter formed by injecting quantum dot (QD) ink for converting blue light emitted from the blue LED to red light and curing the QD ink; and
    a space portion for emitting the blue light emitted from the blue LED without changes.

4. The micro-lens array of claim 1, further comprising:
    A first light absorption layer formed on a bottom surface of the barrier rib to absorb light incident on the bottom surface of the barrier rib.

5. The micro-lens array of claim 1, further comprising:
    A light reflection layer formed on a side surface of the bank portion to reflect light emitted to the side surface of the bank portion.

6. The micro-lens array of claim 1, further comprising:
    a second light absorption layer formed in a region between the lens parts on an opposite surface of the body to absorb the light emitted to the region between the lens parts.

7. The micro-lens array of claim 1, further comprising:
    an air layer that is recessed in a direction toward the lens part at an edge of a bottom surface of the bank portion and totally reflects light emitted to the region between the lens parts.

8. The micro-lens array of claim 1, wherein a bottom surface of the bank portion is convex in a direction toward the lens part to allow light passing through the color converter to be condensed to the lens part.

9. A micro-LED display module using a micro LED as a light emitting material and including a substrate with the micro LED, and a micro-lens array provided above the substrate, the micro-lens array comprising:
- a body;
- a bank portion recessed inward from one surface of the body in one-to-one correspondence to each of the micro-LEDs;
- a lens part protruding on an opposite surface of the body in one-to-one correspondence to each of the micro-LEDs;
- a barrier rib formed between the bank portions; and
- a color converter included in the bank portion and configured to convert color of light emitted from each of the micro-LEDs.

10. The micro-LED display module of claim 9, wherein the micro-lens array is attached and coupled to an upper part of the substrate by an optical clear adhesive (OCA).

11. The micro-LED display module of claim 9, wherein the color converter is integrally formed with the body by injecting quantum dot (OD) ink into the bank portion and curing the QD ink.

12. The micro-LED display module of claim 11, wherein the micro-LED is a blue LED for emitting blue light, and wherein the color converter includes:
- a green converter formed by injecting quantum dot (QD) ink for converting light emitted from the blue LED to green light and curing the QD ink;
- a red converter formed by injecting quantum dot (QD) ink for converting blue light emitted from the blue LED to red light and curing the QD ink; and
- a space portion for emitting blue light emitted from the blue LED without change.

13. The micro-LED display module of claim 9, wherein the micro-lens array further includes a first light absorption layer formed on a bottom surface of the barrier rib to absorb light incident on the bottom surface of the barrier rib.

14. The micro-LED display module of claim 9, wherein the micro-lens array further includes a light reflection layer formed on a side surface of the bank portion to reflect light emitted to the side surface of the bank portion.

15. The micro-LED display module of claim 14, wherein the micro-lens array further includes an air layer that is recessed in a direction toward the lens part at an edge of a bottom surface of the bank portion and totally reflects light emitted to the region between the lens parts.

16. The micro-LED display module of claim 14, wherein a bottom surface of the bank portion is convex in a direction toward the lens part to allow light passing through the color converter to be condensed to the lens part.

17. The micro-LED display module of claim 9, wherein the micro-lens array further includes a second light absorption layer formed in a region between the lens parts on an opposite surface of the body to absorb the light emitted to the region between the lens parts.

18. A method of manufacturing a micro-lens array included in a micro-LED display module using a micro LED as a light emitting material and including a body, a bank portion recessed inward from one surface of the body in one-to-one correspondence to each of micro-LEDs, a lens part protruding on an opposite surface of the body in one-to-one correspondence to each of the micro-LEDs, a barrier rib formed between the bank portions, and a color converter included in the bank portion and configured to convert color of light emitted from each of the micro-LEDs, the method comprising:
- a mold preparation operation of preparing a first mold having one surface, on which an engraved shape of the lens part is formed, and a second mold having one surface, on which an embossed shape of the bank portion is formed;
- a mold alignment operation of aligning the first mold and the second mold with each other on a base mold in a state of being spaced apart at a predetermined interval to allow the engraved shape of the lens part and the embossed shape of the bank portion to be arranged in one-to-one correspondence to each other;
- a polymer injection and curing operation of forming the body including the lens part and the bank portion by injecting transparent polymer into a space between the first mold and the second mold and curing the transparent polymer; and
- a color converter forming operation of forming the color converter in the bank portion.

19. The method of claim 18, wherein the micro-LED is a blue LED for emitting blue light, and the color converter includes a green converter configured to convert light emitted from the blue LED to green light, a red converter configured to convert blue light emitted from the blue LED to red light, and a space part configured to emit the blue light emitted from the blue LED without change, and
wherein the color converter forming operation includes:
- forming the green converter by injecting quantum dot (QD) ink for converting light emitted from the blue LED to green light into a part of the bank portion and curing the QD ink; and
- forming the red converter by injecting quantum dot (QD) ink for converting blue light emitted from the blue LED to red light into a part of the bank portion and curing the QD ink.

20. The method of claim 18, further comprising:
forming a first light absorption layer on a bottom surface of the barrier rib to absorb light incident on the bottom surface of the barrier rib.

* * * * *